United States Patent [19]

Farid et al.

[11] Patent Number: 4,859,572

[45] Date of Patent: Aug. 22, 1989

[54] DYE SENSITIZED PHOTOGRAPHIC IMAGING SYSTEM

[75] Inventors: Samir Y. Farid; Roger E. Moody, both of Rochester, N.Y.

[73] Assignee: Eastman Kodak Company, Rochester, N.Y.

[21] Appl. No.: 189,002

[22] Filed: May 2, 1988

[51] Int. Cl.$^4$ ............................................... G03C 1/68
[52] U.S. Cl. ..................................... 430/281; 430/914; 430/915; 430/916; 522/25; 522/26; 522/27; 522/28; 522/31
[58] Field of Search ............... 430/915, 281, 916, 914; 522/25, 28, 63, 27, 26, 31

[56] References Cited

U.S. PATENT DOCUMENTS

| | | | |
|---|---|---|---|
| 4,050,934 | 9/1977 | Turner | 96/1 R |
| 4,289,842 | 9/1981 | Tan et al. | 430/270 |
| 4,307,182 | 12/1981 | Dalzell et al. | 430/339 |
| 4,353,787 | 10/1982 | Alexander et al. | 204/159.15 |
| 4,399,209 | 8/1983 | Sanders et al. | 430/138 |
| 4,440,846 | 4/1984 | Sanders et al. | 430/138 |
| 4,497,889 | 2/1985 | Fuerniss | 430/260 |
| 4,571,377 | 2/1986 | McGinniss et al. | 430/31 |
| 4,590,147 | 5/1986 | Lindley | 430/286 |
| 4,743,528 | 5/1988 | Farid et al. | 430/281 |
| 4,743,529 | 5/1988 | Farid et al. | 430/281 |
| 4,743,530 | 5/1988 | Farid et al. | 430/281 |
| 4,743,531 | 5/1988 | Farid et al. | 430/281 |
| 4,772,541 | 9/1988 | Gotschalk | 430/339 |

FOREIGN PATENT DOCUMENTS 0223587A 5/1987 European Pat. Off. .
2083832A 3/1982 United Kingdom .

OTHER PUBLICATIONS

Volman et al., *Advances in Photochemistry*, vol. 13, in the chapter titled "Dye Sensitized Photopolymerization" by D. F. Eaton, pp. 427 to 488, John Wiley & Sons (1986).
Farid et al., U.S. Ser. Nos. 933,712, 933,658, 933,660, and 933,657, all filed Nov. 21, 1986, and commonly assigned (Now issued as Farid et al U.S. Pat. Nos. 4,743,528; 4,743,529; 4,743,530; and 4,743,531).

*Primary Examiner*—Paul R. Michl
*Assistant Examiner*—C. D. R. Dee
*Attorney, Agent, or Firm*—Carl O. Thomas

[57] ABSTRACT

A photographic imaging system is disclosed comprised of a hardenable organic component containing ethylenic unsaturation sites and an initiator system for ethylenic addition. The initiator system is comprised of an electron acceptor activator, an electron donor activator, and, acting as a photosensitizer, a dye capable of absorbing imaging radiation. The dye has a reduction potential related to that of the electron acceptor activator and an oxidation potential related to that of the electron donor activator to permit each to release a free radical upon excitation of the photosensitizer by exposure to actinic radiation.

15 Claims, No Drawings

DYE SENSITIZED PHOTOGRAPHIC IMAGING SYSTEM

FIELD OF THE INVENTION

This invention relates to photography. More specifically, this invention relates to an imaging system which relies upon the hardening of organic component containing ethylenic unsaturation to produce an image pattern.

BACKGROUND OF THE INVENTION

A variety of photographic imaging systems are known wherein a hardenable organic component containing ethylenic unsaturation sites is relied upon for image formation. The organic component undergoes photoinduced addition reactions, typically either polymerization or crosslinking, at the ethylenic unsaturation sites which produce hardening and allow image discrimination to be achieved.

A simple illustration of such an imaging system is a negative working photoresist which contains an imaging dye. Imagewise exposure of the photoresist followed by development leaves a dye image in exposed areas. While there are a plethora of known negative working photoresists which might be cited, Tan et al U.S. Pat. No. 4,289,842 illustrates photoresist employing crosslinkable copolymers containing ethylenic unsaturation in pendant groups, Lindley U.S. Pat. No. 4,590,147 illustrates photoresists including vinyl oligomers, and Fuerniss U.S. Pat. NO. 4,497,889 illustrates photoresists containing vinyl monomers.

Illustrative of more elaborate imaging systems capable of producing transferred dye images are Sanders et al. U.S. Pat. Nos. 4,399,209 and 4,440,846. A dye precursor and a hardenable organic component containing ethylenic unsaturation sites are coated together on a support in rupturable microcapsules. Imagewise exposure to actinic radiation hardens the organic component by inducing addition at its ethylenic unsaturation sites. Upon subsequent rupture of the microcapsules only the dye precursor in unexposed microcapsules have the mobility to transfer to a receiving sheet where a viewable dye image is formed.

Since the hardenable organic components containing ethylenic unsaturation exhibit only limited direct response to exposing radiation, it is common practice to include an initiator of the ethylenic addition reaction. In practice negative working photoresists are typically imagewise exposed using radiation wavelengths in the near ultraviolet region of the spectrum. While Sanders et al recognize that imaging exposures are possible with various forms and wavelengthss of radiation, the preferred wavelengths of exposure are limited to the ultraviolet and the blue, up to about 480 nm, with the initiators for the ethylenic addition reaction disclosed being those which are responsive at these wavelengths of exposure.

In order to achieve higher levels of sensitivity (i.e., higher imaging speeds) than can be achieved with a single initiator, it is common practice in preparing imaging compositions to employ coinitiators. One of the coinitiators is a photosensitizer. Photosensitizers are relied upon to capture photons of exposing radiation. The remaining coinitiator is referred to as an activator. The activator is not relied upon to respond directly to exposing radiation, but rather adjacent activator and photosensitizer molecules react, following excitation of the latter by photon capture, causing release of a free radical which in turn induces immobilizing addition reactions at sites of ethylenic unsaturation.

Imaging systems which rely on a combination of an activator and a photosensitizer are typically exposed in the ultraviolet or blue portion of the spectrum. The necessity of using shorter imaging wavelengths places constraints on the master or pattern employed for imaging. For example, a master which presents a longer wavelength visible dye image, but exhibits little variance in ultraviolet or blue transmittance is not well suited for imagewise exposing an imaging system which responds only to ultraviolet or blue radiation. Further, such imaging systems are disadvantageous and have found limited acceptance in producing multicolor images.

Activators are recognized in the art to fall into two distinct classes. One class of activator is referred to as electron acceptor activators. These activators liberate a free radical capable of initiating ethylenic addition by accepting an electron from a photosensitizer in its excited state. The reactions can be diagrammed as follows:

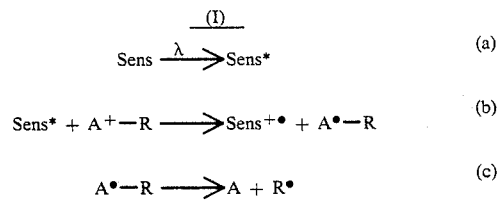

where
Sens represents a photosensitizer,
λ represents exposure to actinic radiation,
* indicates the excited state produced by light absorption on exposure,
$A^+$—R represents the electron acceptor activator,
$A^+$ represents the electron accepting moiety of the activator before an electron is accepted,
A represents the electron accepting moiety of the activator after an electron is accepted, R represents the moiety that is ultimately cleaved as a free radical,
$Sens^{+\cdot}$ shows the photosensitizer converted to a cation radical by loss of an electron, and
· denotes a radical.

The reaction sequence described above is an ideal one in which the electron acceptor activator radical produced by step (b) reacts further as indicated in step (c) to provide a free radical. ignored in this reaction sequence is a possible recombination of the photosensitizer cation radical with the electron acceptor activator radical to regenerate the electron acceptor activator in its initial form and to transform the photosensitizer cation radical into an unexcited dye molecule. This reaction sequence can be diagrammed as follows:

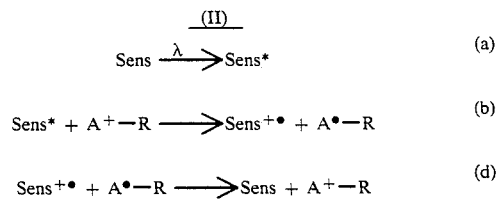

Photon energy is internally dissipated in this reaction sequence, since no free radical is produced and the photosensitizer produced is no longer in an excited state. More efficient imaging systems are those in which reaction step (c) is favored over reaction step (d).

Another class of activator is referred to as electron donor activators. These activators liberate a free radical capable of initiating ethylenic addition by donating an electron to a photosensitizer in its excited state. The reactions can be diagrammed as follows:

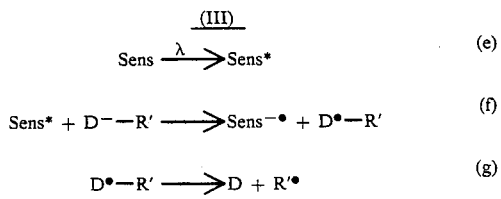

where
D⁻—R' represents the electron donor activator,
D⁻ represents the electron donating moiety of the activator before donating an electron,
D represents the electron donating moiety of the activator after donating an electron,
Sens⁻ shows the photosensitizer converted to a anion by loss of an electron, and
the remaining symbols are as indicated above.

Again, reaction sequence (III) is an ideal one in which the electron donor radical produced by step (f) reacts further as indicated in step (g) to provide a free radical. Ignored in this reaction sequence is a possible reaction of the photosensitizer anion radical with the electron donor activator radical to regenerate the electron donor activator in its initial form and to transform the photosensitizer cation radical into an unexcited dye molecule. This reaction sequence can be diagrammed as follows:

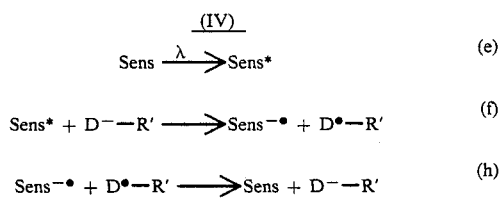

Photon energy is internally dissipated in this reaction sequence, since no free radical is produced and the regenerated photosensitizer is no longer in an excited state. More efficient imaging systems are those in which reaction step (g) is favored over reaction step (h).

A survey of useful electron acceptor and electron donor activators useful with photosensitizers is set forth in Volman et al, *Advances in Photochemistry*, Vol. 13, in the chapter titled "Dye Sensitized Photopolymerization" by D. F. Eaton, pp. 427 to 488, John Wiley & Sons (1986).

Specht and Farid published U.K. Specification No. 3,083,832A discloses photopolymerization coinitiators including an azinium electron acceptor activator and, acting as a photosensitizer, an amino-substituted ketocoumarin.

Gottschalk et al published European Patent Applications No. 0,223,587 discloses a polymerization system including as an initiator a zwitterion consisting of an undissociated borate anion and a dye cation. Disclosed cationic dyes include Methylene Blue, Safranine O, Malachite Green, and various cyanine and rhodamine dyes.

Related Patent Applications

Farid et al U.S. Ser. Nos. 933,712, 933,658, 933,660, and 933,657, all filed Nov. 21, 1986, and commonly assigned, disclose hardenable compositions comprised of an organic compound containing ethylenic unsaturation, an azinium salt activator, and, acting as a photosensitizer, a dye having a reduction potential which is at most 0.1 volt more positive than the reduction potential of the azinium salt activator.

Farid et al U.S. Ser. No. 933,657 discloses the combination of a photosensitizer, an alkoxy azinium electron acceptor activator, and benzene substituted with an electron donating amino group, acting as an imaging enhancer. Although amines are known to be electron donor acceptors, the aminobenzene enhancers require one or more benzene ring substituents having a Hammett sigma value electron withdrawing characteristic of at least +0.20 volt. This substitution renders these compounds ineffective as electron donor activators, as shown by inability to produce an image when combined with a dye in the absence of the electron acceptor activator.

SUMMARY OF THE INVENTION

In one respect this invention is directed to a photographic imaging system comprised of a hardenable organic component containing ethylenic unsaturation sites and an initiator system for ethylenic addition comprised of an electron acceptor activator chosen from the class of activators that liberate a free radical capable of initiating ethylenic addition by accepting an electron from a photosensitizer in its excited state, an electron donor activator chosen from the class of activators that liberate a free radical capable of initiating ethylenic addition by donating an electron to a photosensitizer in its excited state, and, as a photosensitizer, a dye capable of absorbing imaging radiation. The dye has a reduction potential more cathodic, equal to, or up to 0.1 volt less cathodic than that of the electron acceptor activator and an oxidation potential equal to or more anodic, equal to, or up to 0.1 volt less anodic than that of the electron donor activator.

It has been discovered that an initiator system comprised of both an electron acceptor and an electron donor activator in combination with a dye photosensitizer produces distinct advantages. First, the incorporation of activators from both the electron acceptor and electron donor classes approximately doubles the speed of the imaging system, even in systems in which recombination reactions, such as (d) and (h) above are minimal. In systems in which these recombination reactions are significant, even larger increases in speed can be realized. The presence of a dye photosensitizer overcomes a variety of problems in imaging applications, particularly in forming multicolor imaging systems, encountered with photosensitizers absorbing at shorter wavelengths.

DEFINITION OF TERMS

The terms "alkyl (sometimes shortened to the prefix alk)" and "aryl (sometimes shortened to the prefix ar)" are employed throughout to indicate substituents and moieties that can be widely varied. Unless otherwise stated, the carbon atom content of alkyl and aryl substituents and moieties can be assumed to conform to the following norms: It is preferred to choose alkyl substituents from among those that contain 1 to 10 carbon atoms. Aryl substituents preferably contain from 6 to 10 carbon atoms—e.g., phenyl or naphthyl. To minimize molecular bulk lower alkyl groups (those containing from 1 to 5 carbon atoms—e.g., methyl, ethyl, propyl, butyl, and pentyl) and phenyl groups are optimum substituent choices satisfying the alkyl and aryl substituent definitions, respectively. References to alkenyl and alkynyl substituents are to be understood as containing at least 2 carbon atoms, but otherwise having similar numbers of carbon atoms as the alkyl groups.

The terms "more anodic" and "less anodic" are employed in their art recognized usage to mean more positive and less positive, respectively.

The terms "more cathodic" and "less cathodic" are employed in their art recognized usage to mean more negative and less negative, respectively.

DESCRIPTION OF PREFERRED EMBODIMENTS

The present invention is directed to a photographic imaging system comprised of an organic component which is hardened (i.e., significantly increased in molecular weight through polymerization or crosslinking, resulting in an alteration of its physical characteristics, particularly viscosity and/or solubility) by undergoing an addition reaction at sites of ethylenic unsaturation. To facilitate hardening the imaging system includes an initiator system for ethylenic addition comprised of an electron acceptor activator, an electron donor activator, and a dye capable of acting as a photosensitizer.

The initiator system is believed to function in one or both of the following ways, depending upon the specific choice of photosensitizer and activators.

According to one reaction scheme the photosensitizer, after being excited by photon capture from actinic radiation, reacts with the electron acceptor activator to produce a free radical as described above. In other words, reaction sequence I described above occurs. This produces a free radical. The photosensitizer cation radical, which is an unused reaction product of reaction sequence I, then reacts with the electron donor activator to produce a second free radical. Thus, a signal captured photon produces two reactive free radicals as opposed to only one in a conventional system. This results in an approximate doubling of the photographic system of the invention. The reaction sequence can be diagrammed as follows:

(IV)

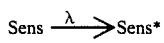 (i)

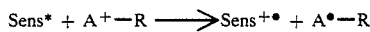 (j)

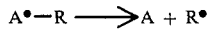 (k)

 (l)

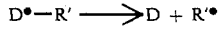 (m)

where
Sens represents a photosensitizer,
$\lambda$ represents exposure to actinic radiation,
* indicates the excited state produced by light exposure,
$A^+$—R represents the electron acceptor activator,
$A^+$ represents the electron accepting moiety of the activator before an electron is accepted,
A represents the electron accepting moiety of the activator after an electron is accepted,
Sens $+\cdot$ shows the photosensitizer converted to a cation radical by loss of an electron,
$D^-$—R represents the electron donor activator,
$D^-$ represents the electron donating moiety of the activator before donating an electron,
D represents the electron donating moiety of the activator after donating an electron,
R and R' represent the moieties that are ultimately cleaved as free radicals, and
· donates a radical.

It is also possible for the photosensitizer after being excited by photon capture from actinic radiation to react with the electron donor activator to produce a free radical. The photosensitizer anion radical then reacts with the electron acceptor activator to produce a second free radical. Again, a single captured photon produces two free radicals as opposed to only one in a conventional system and an approximate doubling of the speed of the photographic system of the invention results. The alternative reaction sequence can be diagrammed as follows:

(V)

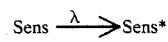 (n)

 (o)

 (p)

 (q)

 (r)

where
Sens $-\cdot$ shows the photosensitizer converted to an anion by reduction and
all the remaining notations are as indicated above.

In looking at reaction sequences IV and V it can be seen that no matter which activator the photosensitizer in its excited state reacts with first, the photosensitizer ion radical is produced which then reacts with the remaining activator. The reaction of the photosensitizer ion radical with the remaining activator removes the photosensitizer ion radical from the system as it is formed and thereby minimizes the possibility of the energy dissipating recombination reactions (d) and (h) occurring. Thus, as compared to conventional systems in which recombination reactions (d) or (h) are significant, the present invention offers the potential of imaging speeds more than twice as large.

When the dye acting as a photosensitizer is exposed to actinic radiation and absorbs a photon, an electron in the highest occupied molecular orbital of the dye is lifted to a higher energy level—namely the lowest unoccupied molecular orbital of the dye, and a vacancy is left behind in the molecular orbital it initially occupied. The electron acceptor activator can accept the electron from the higher energy level orbital within the dye, and the electron donor activator can donate an electron to fill the vacancy in the originally occupied orbital, provided certain relative energy relationships are satisfied.

If the reduction potential of the electron acceptor activator is more cathodic than that of the dye, an electron in the higher energy orbital of the dye is readily transferred from the dye to the highest unoccupied molecular orbital of the electron acceptor activator, since this represents an exothermic process. Even if the process is instead slightly endothermic—i.e., even if the reduction potential of the dye is up to 0.1 volt less cathodic than that of the electron acceptor activator, ambient thermal activation readily overcomes such a small barrier.

In an analogous manner, if the oxidation potential of the electron donor activator is more anodic than that of the dye, an electron moving from the highest occupied molecular orbital of the electron donor activator to the orbital vacancy in the dye is moving from a higher to a lower potential, which again represents an exothermic process. Even if the process is slightly endothermic—i.e., even if the oxidation potential of the dye is up to 0.1 volt less anodic than that of the electron donor activator, ambient thermal activation readily overcomes such a small barrier.

Slightly endothermic reactions in which the reduction potential of the dye is up to 0.1 volt less cathodic than that of the electron acceptor activator or the oxidation potential of the dye is up to 0.1 less anodic than that of the electron donor activator, occur in every instance, regardless of whether the electron acceptor activator or the electron donor activator first reacts with the dye in its excited state. When the activator is reacting with the dye in its excited state, it is preferred that the reaction be exothermic or only slightly endothermic. When the activator is reacting with the dye ion radical, as indicated in reactions (1) and (q) above exothermic reactions are still preferred, but still more endothermic reactions can be expected in many instances occur. Thus, the reduction potential of the dye can be up to 0.2 volt (or more) less cathodic than that of a second to react electron acceptor activator or the oxidation potential of the dye can be up to 0.2 volt (or more) less anodic than that of a second to react electron donor activator.

Thus, by choosing combinations of a dye intended to act as a photosensitizer, an electron acceptor activator, and an electron donor acceptor based on comparisons of their oxidation and reduction potentials, it is possible to select specific three member combinations for initiator systems satisfying the requirements of this invention. The oxidation and reduction potentials of many compounds have been published. If not published, oxidation and reduction potentials can be measured by textbook procedures. For example, oxidation and reduction potentials can be measured as described by R. J. Cox, *Photographic Sensitivity*, Academic Press, 1973, Chapter 15.

The electron donor activator can be chosen from the class of activators that liberate a free radical capable of initiating ethylenic addition by donating an electron to a photosensitizer in its excited state. A variety of known electron donor activators useful in the imaging system of this invention are disclosed by Volman et al, cited above and here incorporated by reference, at pages pp. 439–475. Disclosed classes of electron activators include amines, such as triethanolamine, hydrazine, 1,4-diazabicyclo[2.2.2] octane, tri-n-butylamine, tri-n-propylamine, triethylamine, benzylamine, N-methylpiperidine, quinuclidine, piperidine, pyrrolidine, diethylamine, triethanolamine, aniline, 4-bromoaniline, N-methylaniline, N,N-dimethylaniline, 2-anilinoacetic acid, 2-(3-indolyl)acetic acid, and triphenylamine (and its triphenylphosphine and triphenylarsine analogs); sulfur compounds, such as arylsulfinates (e.g., tolylsulfinates); enolates of diketones, such as acetylacetone and 5,5-dimethyl-1,3-cyclohexanedione (also known as dimedone); acetic acid derivatives, such as 2-(3,4-dimethoxyphenoxy)acetic acid and 2-(4-methoxyphenylthio)acetic acid; allylthiourea; N-phenylglycine; and various azoles, including imidazole, oxazole, and thiazole; and various organiometallic compounds, such as $SnR_4$ compounds, where R is independently in each occurrence chosen from among alkyl, aralkyl (particularly, benzyl)(aryl, and alkaryl substituents—e.g., n-$C_3H_7Sn(CH_3)_3$, (allyl)$Sn(CH_3)_3$, and (benzyl)$Sn(n-C_4H_9)_3$.

Another class of electron donor activators are borates. Such activators can be generally represented by the formula:

where $R^1$, $R^2$, $R^3$, and $R^4$ are independently selected from the group consisting of alkyl, aryl, allyl, aralkyl, alkenyl, alkynyl, alicyclic (preferably 5 to 7 membered cycloalkyl) groups, and saturated and unsaturated heterocyclic groups, such as those completing 5 or 6 membered rings having up to three heteroatoms selected from among oxygen, chalcogen (e.g., sulfur, selenium, or tellurium), or nitrogen; and Y is any convenient counterion. When the remaining substituents are charge neutral, Y is a cation, such as ammonium or an alkali metal. The borate electron donor activators can be selected from among any those disclosed by Gottschalk et al published European Patent Application 0,223,587, cited above and here incorporated by reference.

In a specifically preferred form the borate is an alkyltriarylborate. The three aryl moieties are preferably chosen from among phenyl and lower alkyl substituted phenyl groups, such as tolyl and xylyl. The alky moiety is preferably a lower alkyl moiety.

The electron acceptor activator can be chosen from the class of activators that liberate a free radical capable of initiating ethylenic addition by accepting an electron from a photosensitizer in its excited state. A variety of known electron acceptor activators useful in the imaging system of this invention are disclosed by Volman et al, cited above and here incorporated by reference, at pp. 475–478. Disclosed classes of electron acceptor activators include cationic onium activators, such as ammonium, diazonium (e.g., phenyldiazonium salts optionally substituted with groups such as alkyl, alkoxy, halo, or nitro groups), sulfonium (e.g., optionally alkyl or alkoxy substituted triarylsulfonium salts including adjacent aryl nuclei with 2,2' oxy bridging groups), selenium salt analogues of the sulfonium activators, and iodonium salts (e.g., diphenyl and 2,2'-biphenyl iodonium salts optionally alkyl substituted).

Preferred electron acceptor activators are azinium activators, such as those disclosed by Heseltine et al and Jenkins et al U.S. Pat. Nos. Re. 27,922 and 27,925, Specht and Farid U.K. No. 3,083,832A, and *Research Disclosure*, Vol. 200, Dec. 1980, Item 20036.

The azinium activators include an azinium nucleus, such as a pyridinium, diazinium, or triazinium nucleus. The azinium nucleus can include one or more aromatic rings, typically carbocyclic aromatic rings, fused with an azinium ring. In other words, the azinium nuclei include quinolinium, isoquinolinium, benzodiazinium, and naphthodiazonium nuclei. To achieve the highest attainable activation efficiencies per unit of weight it is preferred to employ monocyclic azinium nuclei.

A quaternizing substituent of a nitrogen atom in the azinium ring is capable of being released as a freeradical upon electron transfer from the photosensitizer to the anzinium activator. In one preferred form the quaternizing substituent is an oxy substituent. The oxy substituent (—O—T) which quaternizes a ring nitrogen atom of the azinium nucleus can be selected from among a variety of synthetically convenient oxy substituents. The moiety T can, for example, be an alkyl radical, such as methyl, ethyl, butyl, etc. The alkyl radical can be substituted. For example, arakyl (e.g. benzyl and phenethyl) and sulfoalkyl (e.g. sulfomethyl) radicals are contemplated. In another form T can be an acyl radical, such as an —C(O)—$T^1$ radical, where $T^1$ can take any of the varied forms of alkyl and aralkyl radicals described above. In addition $T^1$ can be an aryl radical, such as phenyl or naphthyl. The aryl radical can in turn be substituted. For example, $T^1$ can be a tolyl or xylyl radical. T typically contains from 1 to 18 carbon atoms, with alkyl moieties in each instance above preferably being lower alkyl moieties and aryl moieties in each instance preferably containing 6 to 10 carbon atoms. Highest activity levels have been realized when the oxy substituent (—O—T) contains 1 or 2 carbon atoms.

The azinium nuclei need include no substituent other than the quaternizing substituent. However, the presence of other substituents is not detrimental to the activity of the activators. While it is known to include azinium nuclei substituents to increase blue light absorption by the activator directly, substituents capable of performing this function are not required, since the photosensitizer can be relied upon for light absorption.

it is specifically contemplated to employ in combination with the azinium electron acceptor activator an aniline enhancer of the type disclosed in U.S. Ser. No. 933,657, filed Nov. 21, 1986, commonly assigned and cited above, titled ENHANCED IMAGING COMPOSITION CONTAINING AN AZINIUM ACTIVATOR. The anilines contemplated for use as enhancers are those which are ring substituted with one or more groups capable of imparting a net Hammett sigma derived electron withdrawing characteristic of at least +0.20 to the benzene ring. A positive Hammett sigma value is indicative of a substituent which is capable of rendering a phenyl ring electron withdrawing while a negative Hammett sigma value is indicative of a substituent which is capable of rendering a phenyl ring electron donating. Hydrogen is assigned a Hammett sigma value of zero. Lange's Handbook of Chemistry, 12th Ed., McGraw-Hill, 1979, Table 3-12, pp. 3-135 to 3-138, lists Hammett sigma values for a large number of commonly encountered substituents. By algebraically summing the Hammett sigma values of the various ring substituents of the aniline (that is, the ring substituents other than the one required amine substituent) the net Hammett value derived electron withdrawing characteristic of the ring substituents can be determined.

The dyes employed as photosensitizers in the practice of the this invention can be selected from among known dye classes. Preferred dyes are those which exhibit an absorption peak within the visible spectrum—i.e., from about 390 to 700 nm. Dyes are contemplated for use as photosensitizers which have absorption peaks in spectral regions ranging from the near ultraviolet to the near infrared. Specific dye absorption characteristics can be chosen based on the radiation source employed for exposure. For broad spectrum exposure sources, dyes with broad absorption peaks are preferred. For narrow band exposures, including laser exposure sources, it is preferred that the absorption peak of the dye exactly match the maximum emission wavelength of the exposure source. It is generally preferred to employ a subtractive primary dye as a photosensitizer, particularly, when producing multicolor images. A subtractive primary dye has a principal absorption peak in one of the blue (400 to 500 nm), green (500 to 600 nm), or red (600 to 700 nm) regions of the spectrum and appears yellow, magenta, or cyan.

Among specifically contemplated dye classes from which dyes can be selected are coumarin (including ketocoumarin and sulfonocoumarin) dyes, merocyanine dyes, merostyryl dyes, oxonol dyes, and hemioxonol dyes. Dyes from each of the foregoing classes all contain a keto group in the blue absorbing chromophore and are all therefore designated keto dyes. In addition, it is a specific recognition of this invention that a dye photosensitizer useful in the practice of this invention need not be a keto dye. That is, a keto group in the chromophore of the dye is not essential. Non-keto dyes embrace a variety of dye classes, including non-keto polymethine dyes, anthracene dyes, rhodamine dyes, acridine dyes, aniline dyes, and azo dyes. Non-keto polymethine dyes include cyanine, hemicyanine, and styryl dyes.

In one preferred form of the invention the dye photosensitizers are chosen from the polymethine dye class, which includes the cyanines, merocyanines, complex cyanines and merocyanines (i.e., tri-, tetra- and polynuclear cyanines and merocyanines), oxonols, hemioxonols, styryls, merostyryls, and streptocyanines.

The cyanine dyes include, joined by a methine linkage, two basic heterocyclic nuclei, such as azolium or azinium nuclei, for example, those derived from pyridinium, quinolinium, isoquinolinium, oxazolium, thiazolium, selenazolium, indazolium, pyrazolium, pyrrolium, indolium, 3H-indolium, imidazolium, oxadiazolium, thiadioxazolium, benzoxazolium, benzothiazolium, benzoselenazolium, benzotellurazolium, benzimidazolium, 3H- or 1H-benzoindolium, naphthoxazolium, naphthothiazolium, naphthoselenazolium, naphthotellurazolium, carbazolium, pyrrolopyridinium, phenanthrothiazolium, and acenaphthothiazolium quaternary salts.

Exemplary of the basic heterocyclic nuclei are those satisfying Formulae 1 and 2.

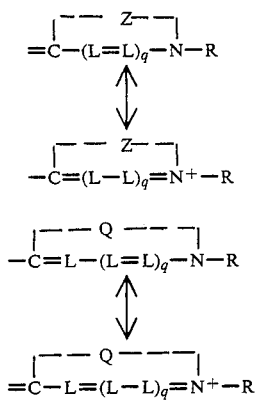

Formula 1

Formula 2 where

Z represents the elements needed to complete a cyclic nucleus derived from basic heterocyclic nitrogen compounds such as oxazoline, oxazole, benzoxazole, the naphthoxazoles (e.g., naphth[2,1-d]-oxazole, naphth[2,3-d]oxazole, and naphth[1,2-d]oxazole), oxadiazole, thiazoline, thiazole, benzothiazole, the naphthothiazoles (e.g., naphtho[2,1—d]thiazole), the thiazoloquinolines (e.g., thiazolo[4,5—d]-quinoline), phenanthrothiazole, acenaphthothiazole, thiadioxazole, selenazoline, selenazole, benzoselenazole, the naphthoselenazoles (e.g., naphtho[1,2—d]-selenazole), benzotellurazole, naphthotellurazoles (e.g., naptho[1,2—d]-tellurazole), imidazoline, imidazole, benzimidazole, the naphthimidazoles (e.g., naphth[2,3—d]imidazole), 2- or 4-pyridine, 2- or 4-quinoline, 1- or 3-isoquinoline, benzoquinoline, 3H-indole, 1H- or 3H-benzoindole, and pyrazole, which nuclei may be substituted on the ring by one or more of a wide variety of substituents such as hydroxy, the halogens (e.g., fluoro, chloro, bromo, and iodo), alkyl groups or substituted alkyl groups (e.g., methyl, ethyl, propyl, isopropyl, butyl, octyl, dodecyl, octadecyl, 2-hydroxyethyl, 3-sulfopropyl, carboxymethyl, 2-cyanoethyl, and trifluoromethyl), aryl groups or substituted aryl groups (e.g., phenyl, 1-naphthyl, 2-naphthyl, 4-sulfophenyl, 3-carboxyphenyl, and 4-biphenylyl), aralkyl groups (e.g., benzyl and phenethyl), alkoxy groups (e.g., methoxy, ethoxy, and isopropoxy), aryloxy groups (e.g., phenoxy and 1-naphthoxy), alkylthio groups (e.g., methylthio and ethylthio), arylthio groups (e.g., phenylthio, p-tolylthio, and 2-naphthylthio), methylenedioxy, cyano, 2-thienyl, styryl, amino or substituted amino groups (e.g., anilino, dimethylamino, diethylamino, and morpholino), acyl groups, (e.g., formyl, acetyl, benzoyl, and benzenesulfonyl);

Q represents the elements needed to complete a cyclic nucleus derived from basic heterocyclic nitrogen compounds such as pyrrole, indole, carbazole, benzindole, pyrazole, indazole, and pyrrolopyridine;

R represents alkyl groups, aryl groups, alkenyl groups, or aralkyl groups, with or without substituents, (e.g., carboxy, hydroxy, sulfo, alkoxy, sulfato, thiosulfato, phosphono, chloro, and bromo substituents);

L is in each occurrence independently selected to represent a substituted or unsubstituted methine group—e.g., $-CR^1=$ groups, where $R^1$ represents hydrogen when the methine group is unsubstituted and most commonly represents alkyl of from 1 to 4 carbon atoms or phenyl when the methine group is substituted; and q is 0 or 1.

Cyanine dyes can contain two heterocyclic nuclei of the type shown in Formula 1 joined by a methine linkage containing an uneven number of methine groups or can contain a heterocyclic nucleus according to each of Formulae 1 and 2 joined by a methine linkage containing an even number of methine groups, where the methine groups can take the form $-CR^1=$ as described above. The greater the number of the methine groups linking nuclei in the polymethine dyes in general and the cyanine dyes in particular the longer the absorption wavelengths of the dyes. For example, dicarbocyanine dyes (cyanine dyes containing five methine groups linking two basic heterocyclic nuclei) exhibit longer absorption wavelengths than carbocyanine dyes (cyanine dyes containing three methine groups linking two basic heterocyclic nuclei) which in turn exhibit longer absorption wavelengths than simple cyanine dyes (cyanine dyes containing a single methine group linking two basic heterocyclic nuclei). Carbocyanine and dicarbocyanine dyes are longer wavelength dyes while simple cyanine dyes are typically yellow dyes, but can exhibit absorption maxima up to about 550 nm in wavelength with proper choice of nuclei and other components capable of bathochromically shifting absorption.

One of the techniques for bathochromically shifting the absorption maxima of polymethine dyes in general and cyanine dyes in particular is to include in the methine linkage an oxocarbon bridging nucleus. Exemplary oxocarbon bridging nuclei can take any of the forms indicated by Formula 3.

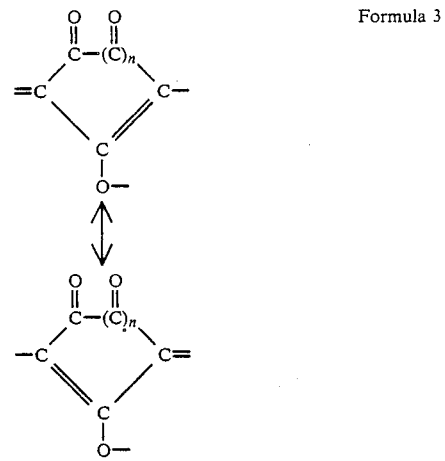

Formula 3 wherein n is the integer 0, 1 or 2.

Merocyanine dyes link one of the cyanine dye type basic heterocyclic nuclei described above to an acidic keto methylene nucleus through a methine linkage as described above, but containing zero, two, or a higher even number of methine groups. Zero methine dyes, those containing no methine groups in the linkage between nuclei, exhibit a double bond linkage between the nuclei in one resonance form and a single bound linkage in another resonance form. In either resonance form the linkage sites in the nuclei are formed by methine groups forming a part of each nucleus. Zero methine polymethine dyes are yellow dyes.

Exemplary acidic nuclei are those which satisfy Formula 4.

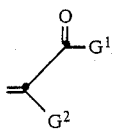

Formula 4 where

G¹ represents an alkyl group or substituted alkyl group, an aryl or substituted aryl group, an aralkyl group, an alkoxy group, an aryloxy group, a hydroxy group, an amino group, or a substituted amino group, wherein exemplary substituents can take the various forms noted in connection with Formulae 1 and 2;

G² can represent any one of the groups listed for G¹ and in addition can represent a cyano group, an alkyl, or arylsulfonyl group, or a group represented by

or G² taken together with G¹ can represent the elements needed to complete a cyclic acidic nucleus such as those derived from 2,4-oxazolidinone (e.g., 3-ethyl-2,4-oxazolidindione), 2,4-thiazolidindione (e.g., 3-methyl-2,4-thiazolidindione), 2-thio-2,4-oxazolidindione (e.g., 3-phenyl-2-thio-2,4-oxazolidindione), rhodanine, such as 3-ethylrhodanine, 3-phenylrhodanine, 3-(3-dimethylaminopropyl)rhodanine, and 3-carboxymethylrhodanine, hydantoin (e.g., 1,3-diethylhydantoin and 3-ethyl-1-phenylhydantoin), 2-thiohydantoin (e.g., 1-ethyl-3-phenyl-2-thiohydantoin, 3-heptyl-1-phenyl-2-thiohydantoin, and arylsulfonyl-2-thiohydantoin), 2-pyrazolin5-one, such as 3-methyl-1-phenyl-2-pyrazolin-5-one, 3-methyl-1-(4-carboxybutyl)-2-pyrazolin-5-one, and 3-methyl-2-(4-sulfophenyl)-2-pyrazolin-5-one, 2-isoxazolin-5-one (e.g., 3-phenyl-2-isoxazolin-5-one), 3,5-pyrazolidindione (e.g., 1,2-diethyl-3,5-pyrazolidindione and 1,2-diphenyl-3,5-pyrazolidindione), 1,3-indandione, 1,3-dioxane-4,6-dione, 1,3-cyclohexanedione, barbituric acid (e.g., 1-ethylbarbituric acid and 1,3-diethylbarbituric acid), and 2-thiobarbituric acid (e.g., 1,3-diethyl2-thiobarbituric acid and 1,3-bis(2-methoxyethyl)-2-thiobarbituric acid).

Useful hemicyanine dyes are essentially similar to the merocyanine dyes described above, differing only in substituting for the keto methylene group of Formula 4 the group shown below in Formula 5.

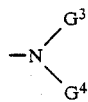

Formula 5 where

G³ and G⁴ may be the same or different and may represent alkyl, substituted alkyl, aryl, substituted aryl, or aralkyl, as illustrated for ring substituents in Formula 1 or G³ and G⁴ taken together complete a ring system derived from a cyclic secondary amine, such as pyrrolidine, 3-pyrroline, piperidine, piperazine (e.g., 4-methylpiperazine and 4-phenylpiperazine), morpholine, 1,2,3,4-tetrahydroquinoline, decahydroquinoline, 3-azabicyclo[3,2,2]nonane, indoline, azetidine, and hexahydroazepine.

Useful hemioxonol dyes exhibit a keto methylene nucleus as shown in Formula 4 and a nucleus as shown in Formula 5 joined by a methine linkage as previously described containing one or a higher uneven number of methine groups.

Useful merostyryl dyes exhibit a keto methylene nucleus as shown in Formula 4 and a nucleus as shown in Formula 6 joined by a methine linkage as described above containing one or a higher uneven number of methine groups.

Formula 6 where

G³ and G⁴ are as previously defined.

The cyanine, merocyanine, hemicyanine, hemioxonol, and merostyryl dyes described above are intended to be illustrative of the simpler structural forms of useful polymethine dyes. It is generally recognized that substituents can join the nuclei and methine linkages to form additional cyclic structures. Further, the dyes can contain three or more nuclei. For example, by substituting a merocyanine dye in its methine linkage with a second basic heterocyclic nucleus of the cyanine dye type an allopolar cyanine dye can be formed. Further, the various substituents not forming a part of the dye chromophore can be varied as desired to tailor dye physical properties, particularly hydrophobicity and hydrophillicity, to suit the particular film forming components employed. By choosing as the aliphatic moieties of the dyes hydrocarbon groups having more carbon atoms (e.g., from about 6 to 20 carbon atoms) the dyes can be rendered more oleophilic while hydrocarbon groups containing fewer numbers of carbon atoms (e.g., 1 to 5 carbon atoms) and particularly those bearing polar substituents render the dyes more hydrophilic. The aromatic moieties of the dyes typically contain from 6 to 10 carbon atoms.

In addition to the initiator system described above the imaging system includes a hardenable organic component containing ethylenic unsaturation sites. Depending upon the application an imaging dye or dye precursor can also be included. In a simple illustrative form the hardenable organic component can take the form of an organic film forming component of a negative-working photoresist optionally having the imaging dye or its precursor blended therewith.

The organic film forming component can take the form of any containing ethylenic unsaturation and capable of selective immobilization by undergoing an additional reaction at the site of the ethylenic unsaturation. Hardening of the film forming component and thus immobilization of the blended imaging dye or dye precursor can be imparted by initiating polymerization of monomers containing ethylenic unsaturation or by initiating crosslinking of linear polymers or oligomers containing ethylenic unsaturation. For example, any of the monomeric or crosslinkable polymeric film forming components disclosed in Jenkins et al and Heseltine et al U.S. Reissue 27,925 or 27,922, respectively, are suitable for use in the photoresists of this invention and are here incorporated by reference. Tan et al U.S. Patent 4,289,842, here incorporated by reference, discloses negative working photoresists containing light sensitive acrylate copolymers containing pendant groups, such as alkenyl groups with ethylenic unsaturation. Lindley U.S. Patent 4,590,147, here incorporated by reference, discloses vinyl oligomers which can be employed as film forming components in the photoresists of this invention. Useful film forming components containing vinyl monomers are disclosed in Fuerniss U.S. Patent 4,497,889 and Anderson et al U.S. Patent 4,535,052, both here incorporated by reference. Kosar *Light-Sensitive Systems*, John Wiley & Sons, 1965, further describes a variety of useful film forming components for use in the practice of this invention, including ethylenically unsaturated monomers and polymers.

Preferred film forming components are comprised of at least one addition polymerizable ethylenically unsaturated compound having a boiling point above 100° C. at normal pressure which is preferably employed in combination with a polymeric binder. The ethylenically unsaturated compound (typically a monomer) and the polymeric binder can be employed together in widely varying proportions, including ethylenically unsaturated compound ranging from 3 to 97 percent by weight of the film forming component and polymeric binder ranging from 97 to 3 percent by weight of the film forming component. A separate polymeric binder, though preferred, is not an essential part of the film forming component and is most commonly omitted when the ethenically unsaturated compound is itself a polymer.

Chang U.S. Pat. No. 3,756,827, here incorporated by reference, discloses in column 2, line 36 to column 3, line 30, a variety of suitable organic monomers for use in the photoresists of this invention. Specifically illustrated in the examples below are ester monomers containing ethylenic unsaturation. Similar monomers include ethylenically unsaturated diester polyhydroxy polyethers, described in Chambers U.S. Pat. No. 4,245,031, here incorporated by reference.

Organic polymeric binders which can form a part of the film forming component of the photoresist include: (1) polyesters, including those based on terephthalic, isophthalic, sebacic, adipic, and hexahydroterephthalic acids; (2) nylons or polyamides; (3) cellulose ethers and esters; (4) polyaldehydes; (5) high molecular weight ethylene oxide polymers—e.g., poly(ethylene glycols), having weight average molecular weights from 4000 to 4,000,000; (6) polyurethanes; (7) polycarbonates; (8) synthetic rubbers—e.g., homopolymers and copolymers of butadienes; and (9) homopolymers and copolymers formed from monomers containing ethylenic unsaturation, such as polymerized forms of any of the various ethylenically unsaturated monomers, such as polyalkylenes—e.g. polyethylene and polypropylene; poly(vinyl alcohol); poly(vinyl esters)—e.g., poly(vinyl acetate); polystyrene; poly(acrylic and methacrylic acids and esters)—e.g., poly(methyl methacrylate) and poly(ethyl acrylate), as well as copolymer variants.

In addition to the film forming component and the coinitiators the negative-working photoresist can contain an imaging dye or an imaging dye precursor. The imaging dye or its precursor can be present in any concentration which imparts a visually discernable coloration to the photoresist when coated on a substrate, exposed to imaging radiation, and then developed. Useful imaging dye concentrations can vary widely, depending upon a variety of factors, such as the extinction coefficient of the dye, the degree of color saturation desired, the manner in which the dye is dispersed, and the dispersing medium.

To achieve highest levels of sensitivity it is generally preferred to choose the imaging dye or its precursor to avoid competition or interaction with the photosensitizer. For example, with an imaging dye present in the imaging system during imagewise exposure if the imaging dye absorbs at the same wavelength as the photosensitizer, the speed of the system is reduced to the extent that the imaging dye captures photons which would otherwise be captured by the photosensitizer. Therefore, it is apparent that the imaging dye, where present during imagewise exposure, is preferably chosen to exhibit a maximum absorption peak in a different portion of the spectrum than the photosensitizer. For instance a cyan (red absorbing) photosensitizer employed with a yellow (blue absorbing) imaging dye exhibits higher levels of sensitivity than when the imaging dye is also a cyan dye. Further, to reduce the possibility of interactions between the photosensitizer and the imaging dye, it is preferred that the imaging dye have an absorption peak at a shorter wavelength than the photosensitizer. With such a relationship the imaging dye is responding to higher energy (shorter wavelength) radiation than the photosensitizer and therefore not likely to interfere with the interaction of the photosensitizer and activator.

Subject to the above considerations imaging dyes can be selected from among the various known classes of dyes. The imaging dyes are preferably selected from among the more light stable dyes, such as azo dyes, anthracene dyes, and the like. The imaging dyes are preferably selected to remain substantially inert during the photohardening step.

In a specific preferred form of the invention, instead of incorporating an imaging dye in the photoresist an imaging dye precursor, such as a leuco dye or other chromogenic material described more specifically below in connection with more elaborate imaging systems, can be employed. The use of a dye precursor which is substantially colorless at the stage of imagewise exposure has the advantage that the dye precursor does not absorb exposing radiation and hence does not compete with the photosensitizer. In other words, higher levels of sensitivity can be realized when a dye precursor is employed for imaging as compared with an imaging dye. For example, an image dye which absorbs at the same wavelength as the photosensitizer does not compete with the photosensitizer for photons when a dye precursor is employed so that the image dye chromophore is not formed until after imagewise exposure has occurred.

In addition to the film forming component, the initiator system, and, optionally, the imaging dye or dye precursor the photoresists can contain any one or combination of known addenda, such as thermal inhibitors, supplemental colorants (e.g., pigments), plasticizers, fillers, etc. To facilitate coating on a substrate the photoresist is usually dispersed in a solvent to create a solution or slurry, the liquid being evaporatively removed after coating. Any solvent can be employed for this purpose which is inert toward the film forming components and addenda of the photoresist. Solvents can be chosen from among a wide variety of organic liquids, including N,N-dimethylformamide; N,N-dimethylacetamide; alcohols, such as methanol, ethanol, butanol, etc.; ketones, such as acetone, cyclohexanone, and butanone; esters, such as ethyl acetate and ethyl benzoate; ethers, such as tetrahydrofuran and dioxane; chlorinated aliphatic hydrocarbons, such as methylene chloride and 1,2-dichloroethane; aromatic hydrocarbons, such as benzene and toluene; and other common solvents, such as dimethyl sulfoxide, chlorobenzene, and various mixtures of solvents.

Any conventional ratio of each activator to film forming component can be present in the photoresists of this invention. Activator concentrations are as a practical matter most conveniently specified in terms of moles of activator per gram of dry solids, the latter constiting of the film forming component and the minor amounts of various addenda, but excluding any liquid component introduced to facilitate coating. Typically from about $5 \times 10^{-7}$ to $3 \times 10^{-4}$, preferably from about $2 \times 10^{-5}$ to $2 \times 10^{-4}$ mole of each activator is present per gram of dry solids. Increases in photographic response can be realized when a minimal concentration of the electron acceptor activator is combined with any of the above concentrations of the electron donor activator or vice versa. It is, however, generally preferred to employ the two activators in a ratio of from 1:10 to 10:1, preferably 25:75 to 75:25 on a mole basis.

In the practice of the present invention the enhancer is an optional coinitiator, meaning that it need not be present or need not be present in en effective amount. However, it is generally preferred to incorporate the enhancer in any convenient effective amount. Typically from about 0.1 to 10 moles per mole of azinium electron acceptor activator are employed. The use of larger amounts is, of course, possible.

The photosensitizer can be present in any concentration capable of increasing the response of the photoresist to visible light. While the photosensitizer concentration can vary widely, it is generally contemplated to photosensitize in concentrations ranging from about $5 \times 10^{-7}$ to $3 \times 10^{-4}$ mole per gram of dry solids. Preferred photosensitizer concentrations are in the range of from $10^{-6}$ to $5 \times 10^{-5}$ mole per gram of dry solids, with optimum concentrations generally being in the range of from about $2 \times 10^{-6}$ to $2 \times 10^{-5}$ mole per gram of dry solids.

The substrate onto which the photoresist is coated can take any convenient conventional form. For imaging, transparent and white reflective substrates are particularly advantageous; however, any substrate which does not exactly match the hue of image dye can be employed. Substrates such as glass, ceramic, metal, cellulose paper, fiberboard, semiconductor, or polymer substrates are illustrative. Specific substrates include alumina-blasted aluminum, anodized aluminum, alumina-blasted poly(ethylene terephthalate) film, poly(ethylene terephthalate) film, flame or electrostatic discharge treated poly(ethylene terephthalate) film, poly(vinyl alcohol)-coated paper, crosslinked polyester-coated paper, nylon, glass, cellulose acetate film, heavy paper, such as lithographic paper, and the like.

In perhaps their most commonly used form photoresists are coated in a fluid form on a substrate and evaporatively dried, usually with heating, to produce a uniform coating. Often, particularly in the manufacture of semiconductor devices, the substrate is spun, thereby employing centrifugal forces to assure the uniformity of the photoresist coating before drying. After exposure to visible radiation causes addition to occur at the ethylenic unsaturation sites of the film forming component, a liquid developer is brought into contact with the coated substrate to remove selectively the photoresist in areas which were not exposed to actinic radiation.

The liquid developer can be any convenient liquid which is capable of selectively removing the photoresist in unexposed areas. The coated photoresist can be sprayed, flushed, swabbed, soaked, or otherwise treated with the developer to achieve selective removal. In its simplest form the liquid developer can be the same liquid employed as a solvent in coating the photoresist. Methoxyethyl acetate and ethoxyethyl acetate are common developers. Also aqueous developers are commonly employed, such as miscible combinations of water and alcohols, with proportions in the range of from 20 to 80 percent water and 80 to 20 percent alcohol being common. Exemplary water miscible alcohols include glycerol, benzyl alcohol, 1,2-propanediol, sec-butyl alcohol, and ethers derives from glycols, such as dihydroxy poly(alkylene oxides). Lactone developers, such as those disclosed by Martinson et al U.S. Pat. No. 3,707,373, can be employed. Optimum developer choices for specific photoresists are disclosed in the various patents cited above illustrating the specific film forming components.

Following development a retained dye image is presented by the photoresist coating remaining on the substrate. The colored areas correspond to the areas of exposure. Multicolor images, such as images employed for color proofing, can be produced by superimposing three elements each comprised of a transparent support and a photoresist image, where each image is formed by a different additive or subtractive primary dye.

In the foregoing imaging systems only a single coated layer is required for imaging. However, it is recognized that the imaging systems of the invention can employ multiple layers. For example, instead of blending the imaging dye with the film forming component as described above, a separate imaging dye layer can be coated between the substrate and the photoresist layer. Upon imagewise exposure and development the photoresist is removed in exposed areas. When the photoresist remains the underlying image dye remains in its initial immobilized condition, while in other areas the dye can be removed or decolorized by washing or any other convenient technique.

Instead of forming retained dye images with photoresist coatings as described above, it is specifically contemplated to form transferred dye images. For example, instead of removing the film forming component of the photoresist layer in unexposed areas by development following imagewise hardening, the unhardened areas of the photoresist layer or only the imaging dye or dye precursor contained in these areas can be selectively transferred to a receiver. For example, the greater tackiness of the unhardened areas can be relied upon to permit their transfer by first laminating the imagewise exposed layer to a receiver sheet and then stripping. In another approach, the hardened portions of the imagewise exposed layer can be relied upon to reduce the mobility of the image dye or dye precursor so that imaging dye is transferred to or formed in the receiver only in areas corresponding to unexposed areas of the photoresist layer. Other variant approaches of forming transferred images should be apparent from the description of other imaging systems below.

In the foregoing description of photoresists the hardenable organic component containing ethylenic unsaturation sites is a film forming component. However, in certain preferred imaging systems of the invention the hardenable organic component can be present as a discontinuous or internal phase forming microcapsules which can be in contact with a surrounding continuous phase or separated therefrom by intervening rupturable encapsulating walls. While it is possible to coat microcapsules each containing the hardenable organic component, coinitiators, and imaging dye or dye precursor to form a single color image, the present invention makes possible the formation of multicolor images employing a single layer of microcapsules coated on a support. Since the microcapsules form discrete packets of materials, it is possible to mix in the same layer microcapsules containing dye photosensitizers which absorb at differing locations in the visible spectrum and imaging dyes (or their precursors) of differing imaging hues. For example, it is contemplated to coat as a single layer on a substrate (a) microcapsules containing a yellow dye photosensitizer and a yellow or blue imaging dye or its precursor, (b) microcapsules containing a magenta dye photosensitizer and a magenta or green imaging dye or its precursor, and (c) microcapsules containing a cyan dye photosensitizer and a cyan or red imaging dye or its precursor. Except for the choice of dye photosensitizer and imaging dye the microcapsules can be otherwise identical. Thus, merely by blending three differing populations of microcapsules it is possible to obtain multicolor images with the same ease and facility as monochromic dye images are obtained. Except for hue selection of components and blending of microcapsule populations prior to coating, monochromic and multicolor imaging according to this invention are identical. Therefore, for simplicity the description which follows is in terms of monochromic imaging, but the description is applicable to both monochromic and multicolor imaging, except as specifically noted.

The microcapsules can be employed to produce either a retained or a transferred dye image. Further, either a preformed dye or, preferably, a dye precursor can be contained in the microcapsules.

In the retained imaging system a receiver layer is coated on a substrate and is overcoated by a layer of microcapsules. Within each coated microcapsule exposure to light which is absorbed by the dye photosensitizer results in release of free radicals by the activators which in turn results in hardening of the organic component containing ethylenic unsaturation. Subsequent uniform rupture of all the coated microcapsules, as by passing the exposed element between pressure rollers, results in migration of imaging dye or its precursor from the microcapsules which were not exposed and hence were not internally hardened.

The released dye or dye precursor diffuses into the received layer. Where an imaging dye is contained in the microcapsules, the receiver layer can be formed of any convenient transparent dye penetrable material. For example, the dye can enter a hydrophilic colloid layer or film forming polymer layer. Preferably a mordant is present in the receiver layer to immobilize the iamge dye on receipt.

When the microcapsules contain a dye precursor, the dye image forming layer contains a second component capable of interacting with the dye precursor to form the image dye. One of the two components is hereinafter referred to as a chromogenic material and the other is referred to as a developer. Either or both can be viewed as a dye precursor and either can be located within the microcapsules with the other located in the dye image forming layer in monochromic imaging. However, for multicolor imaging the chromogenic materials, which differ based on the hue of the dye to be produced, are located within the microcapsules. For simplicity subsequent discussion is directed to chromogenic materials contained in the microcapsules with developer being located in the receiver layer, but the converse arrangement is possible, except as specifically noted. The receiver layer can be similar to the receiver for a preformed imaging dye, differing only by the additional inclusion of a developer.

Transferred dye image systems can be similar to the retained dye image systems described above, but differ in the location of the receiver layer. Instead of coating the receiver layer on the same support as the microcapsules, the receiver layer is coated on a separate support. In integral format arrangements the receiver layer and its support can be associated with the microcapsule layer and its support at the time of exposure as well as at the time transfer to the receiver from the microcapsules occurs. Alternatively, the receiver layer and its support need not be associated with the microcapsule layer until rupture of the microcapsules occurs. In either arrangement the receiver layer and its support can be employed alone as the image bearing element or can be retained with the microcapsule layer and its support. in the latter instance the decolorization of the photosensitizer by room light in the image bearing element and the initially colorless form of the chromogenic material are particularly advantageous.

In general similar materials can be employed in forming the microcapsule systems described above as have been previously described in connection with negative-working photoresists, the principal difference being in the physical continuity of the iamging layer. However, certain materials described below have been found to be particularly well suited to use in microcapsule imaging systems and constitute preferred materials.

Preferred hardenable organic components containing ethylenic unsaturation include compounds containing at least one terminal ethylenic group per molecule and preferably two or more terminal ethylenic groups per molecule. Typically they are liquid and can also double as a carrier oil for the chromogenic material in the internal phase. Representative examples of these compounds include ethylenically unsaturated acid esters of polyhydric alcohols such as trimethylol propane triacrylate. Another preferred hardenable component can include an acrylate prepolymer derived from the partial reaction of pentaerythritrol with acrylic acid or acrylic acid esters. Such materials are available from Richardson Company, Melrose Park, Ill. —e.g., Rl-1482 and Rl-1483. Also useful are isocyanate modified acrylate, methacrylate, and itaconic acid esters of polyhydric alcohols, such as disclosed by Carlick et al U.S. Pat. Nos. 3,825,479; 3,759,809; and 3,783,151.

The chromogenic materials used in the present invention are preferably oil soluble color formers which produce a dye upon reaction with a developer in the presence of a carrier oil. Representative examples of such chromogenic materials include substantially colorless compounds including a lactone, lactam, sultone, spiropyran, ester, or amido structure. Specifically preferred chromogenic materials are triarylmethane, bisphenylmethane, xanthene, thiazine, spiropyran, and similar compounds. Also useful as chromogenic materials are organic compounds capable of complexing with heavy metals to form dyes—e.g., copper phthalocyanine. Specific chromogenic materials, including specific additive and subtractive primary dye forming chromogenic materials, are disclosed in U.S. Pat. Nos.

3,920,510; 4,399,209; and 4,440,846, here incorporated by reference.

In addition to the hardenable organic component, the initiator system, and the chromogenic material, the discrete phase or microcapsules can also contain a carrier oil. Preferred carrier oils are weekly polar solvents having boiling points above 170° C. and preferably in the range of from 180° C. to 300° C. Exemplary carrier oils include alkylated biphenyls (e.g., monoisopropylbiphenyl), polychorinated biphenyls, caster oil, mineral oil, deodorized kerosene, naphthenic mineral oils, dibutyl phthalate, dibutyl fumerate, brominated paraffin, and mixtures thereof. Alkylated biphenyls are preferred on the basis of low toxicity while brominated paraffins employed in combination with trimethylol propane triacrylate are particularly preferred for halftone imaging.

Carrier oils are not required. As previously noted the hardenable organic component can in many instances perform the mobility providing function of a carrier oil, particularly where the hardenable organic component is a monomer. The choice of carrier oil will depend to some extent on the chromogenic material to be transported on rupture of the microcapsule. Carrier oils are chosen on the basis of their ability to impart mobility to the chromogenic material in the absence of hardening of the organic component containing ethylenic unsaturation as well as being nonreactive with the various components of the microcapsules.

The internal phase forming the microcapsules is then comprised of the hardenable organic component, an optional carrier oil, a chromogenic material, coinitiators, and any of a variety of optional components intended to offer improvement in imaging properties, such as light scattering materials, stabilizers, and the like.

The materials forming the internal phase of the microcapsules can be present in generally similar concentration ranges as previously described in connection with photoresists. In general the hardenable organic component constitutes at least about 40 percent by weight of the internal phase and typically constitutes from about 50 to 99 percent by weight of the internal phase. The chromogenic material can be present in any concentration compatible with providing a visible dye image. In general useful concentrations range from about 0.5 to 20.0 percent by weight, based on the weight of the internal phase. A preferred range of chromogenic material for monochromic imaging is from about 2 to 7 percent by weight of the internal phase. in multicolor imaging a somewhat higher concentration of chromogenic material is preferred, since only a third of the microcapsules are available to provide a maximum image dye density of any primary hue. For example, a maximum density magenta image must be formed using only the one third of the microcapsules containing the chromogenic material which forms a magenta dye. A preferred range of chromogenic material for multicolor imaging is from about 5 to 15 percent by weight of the internal phase. Carrier oils are not required, but can be present in concentrations of up to about 50 percent by weight of the internal phase, preferably in concentrations of from about 10 to 40 percent of the internal phase. The coinitiators can be present in the same concentrations set out above for the photoresists, where the dry solids percent bases correspond to internal phase percentage bases for the microcapsule utility.

In preferred forms the microcapsules each include in addition to the internal phase a rupturable surrounding encapsulating wall. Encapsulation can be undertaken in any convenient conventional manner. Oil soluble chromogenic materials have been encapsulated in hydrophilic wall forming materials, such as gelatin and gelatin derivatives (e.g., phthalated gelatin), gum arabic, poly(vinyl alcohol), and carboxymethylcellulose wall forming materials, as illustrated by Green et al U.S. Pat. Nos. 2,730,456 and 2,800,457; resorcinol-formaldehyde wall formers, as illustrated by Vassiliades U.S. Pat. No. 3,914,511; isocyanatepolyol wall formers, as illustrated by Kiritani et al U.S. Pat. No. 3,796,669; urea-formaldehyde wall formers, particularly urea-resorcinol-formaldehyde wall formers, as illustrated by Foris et al U.S. Pat. Nos. 4,001,140, 4,087,376, and 4,089,802; melamineformaldehyde resin wall formers; and hydroxypropyl cellulose wall formers, as illustrated by Shackle U.S. Pat. No. 4,025,455; all of the foregoing patents being here incorporated by reference. The wall formers must, of course, be capable of transmitting exposing radiation. Preferred wall formers are gelatin and gelatin derivatives as well as urea-resorcinolformaldehyde wall formers. Microencapsulation can be accomplished by any convenient conventional technique, including coacervation, interfacial polymerization, polymerization of one or more monomers in oil, as well as various melting dispersing, and cooling methods.

The microcapsules normally are chosen to be of a size too small to be individually discerned by the unaided eye. The microcapsules preferably range from about 1 to 25 micrometers ($\mu$m) in diameter, more typically from about 3 to 15 $\mu$m in diameter, depending upon the sharpness of the image desired, the smoothness of the support surface, and the technique used for rupturing the microcapsules. Generally the sharpness of the dye image increases as the size of microcapsules decreases. However, smaller microcapsules are less easily coated on rough surface supports and less easily ruptured uniformly by mechanical techniques.

The microcapsules are normally coated at a density sufficient to at least cover the surface of the support. That is, based on the average diameter of the microcapsules the coating coverage is chosen to provide at least a monolayer coverage of microcapsules on the support.

Instead of forming the microcapsules with discrete walls, it is appreciated that microcapsule containing compositions suitable for coating on a substrate can be produced by forming an emulsion in which the microcapsules constitute the discontinuous or internal phase of a binder analogous to the wall formers above constituents the continuous phase. For example, such microcapsule coatings can be formed employing hydrophilic binders, such as hardened gelatin and gelatin derivatives.

Reacting with the chromogenic material (or first dye precursor) is a developer (or second dye precursor). The developer can take the form of any material capable of reacting with the chromogenic material to produce a dye. For the preferred classes of chromogenic materials identified above illustrative developers include clay minerals, such as acid clay, and active clay attapulgite; organic acids such as tannic acid, gallic acid, and propyl gallate; acid polymers, such as phenolformaldehyde resins; condensates of carboxylic acids containing at least one hydroxy group and formaldehyde; metal salts of aromatic carboxylic acids, such as zinc salicylate, tin salicylate, zinc 2-hydroxynaphthenoate, zinc 3,5-di-tert-butylsalicylate; oil soluble metal salts of phenol-formaldehyde novolak resins (more specifically illustrated by U.S. Pat. Nos. 3,672,935; 3,732,120; and 3,737,410), zinc carbonate, and mixtures of the above.

When the developer is coated on a substrate, as is preferred, the developer is typically dispersed in a binder. The binder is chosen to be a relatively dye permeable inert material, such as poly(vinyl alcohol), gelatin or a gelatin derivative, maleic anhydride-styrene copolymer, starch, gum arabic, or a cellulose ester. In general well known film forming binders are useful. As mentioned above, a mordant can be incorporated in the binder for the developer to assist in immobilizing the dye once it is formed. A variety of mordants particularly compatible with gelatin and gelatin derivatives are disclosed by Hartman U.S. Pat. No. 4,315,978.

While the microcapsule containing imaging system has been described above in terms of employing a chromogenic material and a developer, it is appreciated that mobile imaging dyes can be substituted for the the chromogenic material, if desired. The advantage of employing chromogenic materials is that the chromogenic material need contain no chromophore to compete with the dye photosensitizer for photon dye capture. Further, the chromogenic material minimizes coloration of the imaging system in areas where no image dye is formed.

While the preferred microcapsule imaging systems above have been described in terms of forming a discontinuous oleophilic phase in a continuous hydrophilic phase, it is appreciated that the reverse relationship is also possible. It is specifically contemplated to form microcapsules containing dyes or chromogenic materials which are more hydrophilic and to rely on the relative hydrophobicity if not impermeability of the microcapsule walls to initially confine the dyes. Where microcapsule wall formers are present, the same relatively hydrophilic binders described above can still be employed. The important point to note is that an extremely broad range of imaging dyes and chromogenic materials are available for use. Hartman U.S. Pat. No. 4,315,978 illustrates a variety of yellow, magenta, and cyan dyes containing polar substituents to impart mobility in more hydrohpilic media.

It is specifically contemplated to modify the imaging systems disclosed by Gottschalk et al published European Patent Application No. 0,223,587, here incorporated by reference, by substituting the initiator system of this invention for that disclosed therein.

While the invention has been described above in terms of forming dye images, it is appreciated that negative-working photoresist compositions often include no colorant or colorant precursor, since their primary purpose is to define a protective image rather than an image that is intended for viewing.

An illustration of a negative-working resist application of the invention which requires no incorporated image dye or image dye precursor is provided by a tape assisted bonding application of the invention. As disclosed by Guild U.S. Pat. No. 4,247,623, a useful intermediate article for packing integrated circuits is a a tape having a metal layer laminated between a positive-working photoresist layer and a negative-working photoresist layer. Since the negative-working photoresist acts as a support for beam leads for the integrated circuit package formed from the metal layer, it is chosen to exhibit desirable dimensional stability and hardness at temperatures of 200° C. and higher. Binders are therefore chosen for the photoresist having a glass transition temperature of at least 150° C. Examples of useful polymeric binders known to have thermal properties compatible with the above requirements include polyacrylates, polyamides, polycarbonates, polyesters, polyesteramides, polyimides. preferred binders are those disclosed in U.S. Pat. No. 4,322,490. Further details of preferred negative-working photoresists for this application are set out in Klein et al U.S. Ser. No. 77,714, filed July 24, 1987, commonly assigned, now U.S. Pat. No. 4,792,517.

EXAMPLES

The invention can be better appreciated by reference to the following specific examples.

EXAMPLE 1

Control 1

An photographic imaging composition PI-1 was prepared, formulated as follows:

| | |
|---|---|
| 2.34 g | Binder A |
| 1.17 g | Monomer A |
| 1.17 g | Monomer B |
| 0.012 g | Inhibitor A |
| 0.02 mmol | Activator A |
| 0.02 mmol | Photosensitizer A |
| 10.32 g | Solvent (Dichloromethane) |

Binder A exhibited the following structure

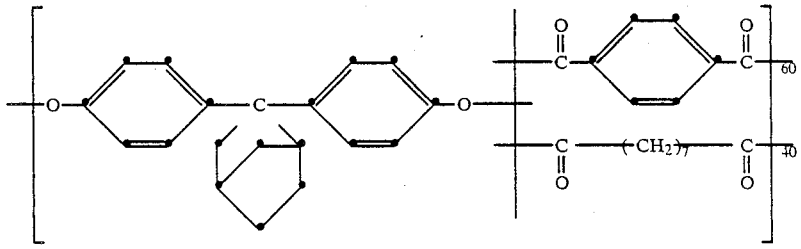

Monomer A exhibited the following structure

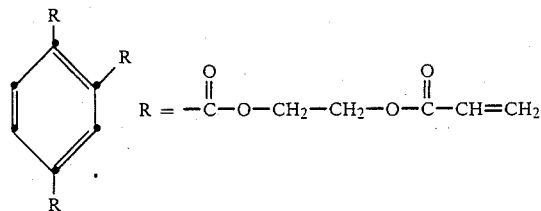

Monomer B exhibited the following structure

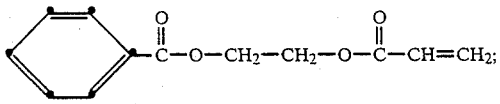

Inhibitor A exhibited the following structure

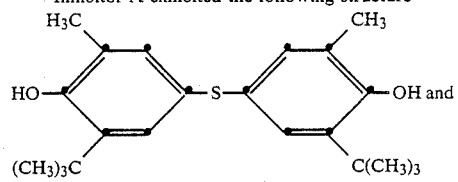

Activator A was 1-methoxy-4-phenylpyridinium tetrafluoroborate.

Photosensitizer A was 1,1',9-triethylbenzothiazolocarbocyanine trifluroacetate.

PI-1 was coated on a copper sheet using a 0.3 mm coating knife and dried for 10 minutes at about 70° C. A transparent polypropylene cover sheet was then placed over the coating.

Since PI-1 without PHotosensitizer A responds to ultraviolet exposures, shorter wavelengths were removed during exposure using a W-16 Wratten ® filter capable of filtering 99.9 percent of radiation of less than 510 nm in wavelength.

To determine the degree of effectiveness of the initiator system exposure of a coated sample was undertaken through a Kodak T-14 ® step tablet having 14 equal increment density steps ranging in density from essentially zero to 2.1. A three minutes exposure was undertaken using a Nu-arc FT32L ® flip-top platemaker equipped with a 4000 watt pulsed Xenon lamp. After exposure the sample was baked for 10 minutes at 70° C. and spray developed for two minutes. Development was undertaken using 1,1,1-trichloroethane as a developer. Response was measured in terms of the number of stepped exposure areas (steps) in which the photoresist was retained following exposure. For example, a sample which was retained following exposure and development on 10 steps, but was absent from the remaining four steps was assigned a step rating of 10. If partial retention of the photoresist was observed on the eleventh step, this was indicated by assigning a plus rating—i.e., 10+. On the other hand, where the photoresist retention was deemed just barely adequate to merit the step rating, this was indicated by assigning a minus rating—i.e., 10-.

PI-1 exhibited a step rating of 10.

Control 2

Control 1 was repeated as described, except that the concentration Activator A was doubled. No observable increase in speed was observed.

Control 3

A second imaging composition PI-2 was prepared identical to PI-1, but with Activator B in a concentration of 0.02 mmol substituted for Activator A.

Activator B was tetrabutylammonium butyltriphenylborate. PI-2 was clearly inferior to PI-1 in its imaging response. The concentration of Activator B was chosen after running a concentration series indicating that further increases in concentration were producing little, if any, further increases in imaging speed.

EXAMPLE 1

A third imaging composition PI-3 was prepared identical to PI-1, but with Activator B added. That is, this imaging composition contained Activator A, Activator B, and Photosensitizer A as a three member initiator system. The imaging speed of the composition PI-3 was between 1.5 times and 2.0 times faster than the imaging speed of PI-1 and faster by an even greater amount than PI-2.

This result demonstrates that the combination of an electron acceptor activator, such Activator A, and an electron donor activator, such as Activator B, in a photographic imaging system in combination with a dye photosensiter produces a synergistic initiator system that unexpectedly increases imaging response.

EXAMPLE 2

Control 3

A photographic imaging system PI-4 was prepared and tested similarly as PI-1, except that Photosensitizer B, 1,1'-diphenylbenzoxazolocarbocyanine iodide, was substituted for Photosensitizer A. The dye exhibited an absorption peak of 499 nm.

Since PI-4 without Photosensitizer B responds to ultraviolet exposures, shorter wavelengths were removed during exposure using a W-2A Wratten ® filter capable of filtering 99.9 percent of radiation of less than 400 nm in wavelength.

Control 4

Another imaging composition PI-5 was prepared identical to PI-4, but with Activator B substituted for Activator A. PI-4 was clearly inferior to PI-3 in its image response.

EXAMPLE 2

An additional imaging composition PI-5 was prepared identical to PI-4, but with Activator B added. That is, this imaging composition contained Activator A, Activator B, and Photosensitizer B. The imaging speed of the composition PI-5 was between 1.7 times and 2.2 times faster than the imaging speed of PI-3 and faster by an even greater amount than PI-4.

This result further demonstrates that the combination of an electron acceptor activator, such Activator A, and an electron donor activator, such as Activator B, in a photographic imaging system in combination with a dye photosensiter produces a synergistic initiator system that unexpectedly increases imaging response.

The invention has been described in detail with particular reference to preferred embodiments thereof, but it will be understood that variations and modifications can be effected within the spirit and scope of the invention.

What is claimed is:

1. A photographic imaging system comprised of
a hardenable organic component containing ethylenic unsaturation sites and
an initiator system for ethylenic addition comprised of an activator pair and a photosensitizer consisting of
a cationic onium electron acceptor activator chosen from the class of activators that liberate a free radical capable of initiating ethylenic addition by accepting an electron from a photosensitizer in its excited state,
an electron donor activator chosen from the class of activators that liberate a free radical capable of initiating ethylenic addition by donating an electron to a photosensitizer in its excited state, said electron donor activator including a borate anionic moiety that satisfies the formula:

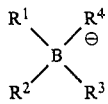

where
$R^1$, $R^2$, $R^3$, and $R^4$ are independently selected from the group consisting of alkyl of from 1 to 18 carbon atoms, aryl of from 6 to 18 carbon atoms, allyl, aralkyl in the aryl moiety contains from 6 to 18 carbon atoms and the alkyl moiety contains 1 to 5 carbon atoms, alkenyl of from 2 to 10 carbon atoms, alkynyl of from 2 to 18 carbon atoms, cycloalkyl of from 5 to 7 carbon atoms, and 5 and 6 membered heterocyclic rings having up to three heteroatoms selected from the group consisting of oxygen, nitrogen, and a middle chalcogen chosen from the group consisting of sulfur, selenium, and tellurium, and, as a photosensitizer, a dye capable of absorbing imaging radiation to achieve an excited state, said dye having a reduction potential more cathodic, equal to, or up to 0.1 volt less cathodic than that of the electron acceptor activator and an oxidation potential more anodic, equal to, or up to 0.1 volt less anodic than that of the electron donor activator.

2. A photographic imaging system according to claim 1 in which said hardenable organic component is comprised of at least one addition polymerizable ethylenically unsaturated compound having a boiling point above 100° C. at normal pressure.

3. A photographic imaging system according to claim 2 in which said polymerizable ethylenically unsaturated compound is a monomer.

4. A photographic imaging system according to claim 2 in which said polymerizable ethylenically unsaturated compound is an oligomer.

5. A photographic imaging system according to claim 2 in which said polymerizable ethylenically unsaturated compound is a crosslinkable polymer.

6. A photographic imaging system according to claim 1 in which said photosensitizer exhibits a reduction potential that is more cathodic than the reduction potential of said electron acceptor activator.

7. A photographic imaging system according to claim 1 in which said photosensitizer exhibits an oxidation potential that is more anodic than the oxidation potential of said electron donor activator.

8. A photographic imaging system according to claim 1 in which said photosensitizer is a rhodamine, anthracene, azo, aniline, or acridine dye.

9. A photographic imaging system according to claim 1 in which said photosensitizer is a polymethine dye.

10. A photographic imaging system according to claim 9 in which said photosensitizer is a cyanine, merocyanine, oxonol, hemioxonol, styryl, merostyryl, or streptocyanine dye.

11. A photographic imaging system according to claim 1 in which said photosensitizer is a subtractive primary dye.

12. A photographic imaging system according to claim 1 additionally including an imaging dye or a precursor thereof.

13. A photographic imaging system according to claim 2 in which said imaging dye is an additive or subtractive primary dye.

14. A photographic imaging system according to claim 1 in which said electron acceptor activator is an azinium salt activator.

15. A photographic imaging system according to claim 14 in which said azinium salt activator is an N-alkoxypyridinium salt.

* * * * *